US 6,653,893 B2

(12) United States Patent
Casper et al.

(10) Patent No.: US 6,653,893 B2
(45) Date of Patent: Nov. 25, 2003

(54) VOLTAGE MARGIN TESTING OF A TRANSMISSION LINE ANALOG SIGNAL USING A VARIABLE OFFSET COMPARATOR IN A DATA RECEIVER CIRCUIT

(75) Inventors: Bryan K. Casper, Hillsboro, OR (US); Stephen R. Mooney, Beaverton, OR (US); Matthew B. Haycock, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/967,666

(22) Filed: Sep. 28, 2001

(65) Prior Publication Data

US 2003/0001667 A1 Jan. 2, 2003

Related U.S. Application Data

(63) Continuation-in-part of application No. 09/895,625, filed on Jun. 29, 2001, now Pat. No. 6,420,932.

(51) Int. Cl.[7] .................................................. H03F 3/45
(52) U.S. Cl. ................................ 330/9; 703/1; 703/13; 341/120; 330/258; 330/252; 330/259
(58) Field of Search ........................... 330/258, 9, 252, 330/259; 327/124, 307; 703/1, 13; 341/120

(56) References Cited

U.S. PATENT DOCUMENTS

| 4,754,169 A | 6/1988 | Morris |
| 4,987,327 A | 1/1991 | Fernandez et al. |
| 5,563,598 A | 10/1996 | Hickling |
| 6,313,769 B1 | * 11/2001 | Mangahas et al. .......... 341/120 |
| 6,348,882 B1 | 2/2002 | Ciccone et al. |
| 6,388,521 B1 | 5/2002 | Henry |
| 6,420,932 B1 | * 7/2002 | Casper ....................... 330/258 |

FOREIGN PATENT DOCUMENTS

JP          291951     * 11/1993

OTHER PUBLICATIONS

Peralias et al. "A PFT Technique for Analog–to–Digital Converters with Digital Correction" VLSI Test Symposium, 15th IEEE Apr. 27–May 1, 1997 pp 302–307.*

* cited by examiner

Primary Examiner—Michael B Shingleton
(74) Attorney, Agent, or Firm—Blakely, Sokoloff, Taylor & Zafman LLP

(57) ABSTRACT

A data receiver circuit having a comparator that exhibits substantially variable offset that is controllable to represent a variable reference level, without a separate input to receive a reference voltage level. The comparator output provides an indication of the comparison between a fixed voltage level applied to its differential signal input and the variable reference level. While changing an offset code that is fed to an offset control input of the comparator, and while applying a fixed voltage level that represents a symbol in the transmission line analog signal, a value of the offset code which causes the output of the comparator to change states is captured. A similar process may be repeated for different symbol values that can be transmitted, such that an indication of the voltage margin may be obtained as a difference between two captured offset codes. Circuitry to perform the process may be provided on-chip to the receiver circuit.

20 Claims, 7 Drawing Sheets

VOLTAGE MARGIN TESTING OF A TRANSMISSION LINE ANALOG SIGNAL USING A VARIABLE OFFSET COMPARATOR IN A DATA RECEIVER CIRCUIT

This application is a continuation-in-part of Ser. No. 09/895,625 entitled "Variable Offset Amplifier Circuit", filed Jun. 29, 2001, now U.S. Pat. No. 6,420,932 status pending.

Some of the subject matter in this application may be related to the material disclosed in the following U.S. applications of Casper and others (which are assigned to the same assignee as that of this application):

Ser. No. 09/968,349, "Multi-Level Receiver Circuit With Digital Output Using a Variable Offset Comparator", filed on the same date as the present application. (11934)

Ser. No. 09/967,804, "Equalization of a Transmission Line Signal Using a Variable Offset Comparator", filed on the same date as the present application. (11936)

BACKGROUND

This invention is in general related to input/output (i.e., I/O) data communication circuits and more particularly to testing the voltage margin of a communication link at a receiver circuit.

I/O circuits act as the interface between different logic functional units of an electrical system. The functional units may be implemented in separate integrated circuit dies (i.e., IC chips) of the system. These chips may be in separate IC packages that have been soldered to a printed wiring board (i.e., PWB). The chips communicate with each other over one or more conductive transmission lines. The transmission lines may be a parallel bus formed on a PWB, and they may be of the point-to-point or multi-drop variety. Alternatively, the transmission line may be a serial link such as a coaxial cable. In both cases, each chip has an I/O circuit that includes a driver and a receiver for transmitting and detecting symbols. The driver and receiver translate between on-chip signaling and signaling that is suitable for high speed transmission (e.g., at several hundred megabits per second and higher) over a transmission line. In a 'bidirectional link', the driver and receiver pair are connected to the same transmission line.

In multi-level data communications, each transmitted symbol can have one of three or more values. For example, each symbol in a four pulse amplitude modulation (i.e., 4 PAM) link may only be a 0, 1, 2, or 3. In contrast, each symbol in a binary communication link may only be 0 or 1. For the binary link, the two symbol values may be detected using a single comparator whose reference level is fixed at the midpoint between the 0 and 1 nominal signal levels. A single digital 'bit' at the output of the comparator yields the symbol value. In contrast, a 4 PAM multi-level receiver may use three comparators whose respective reference levels have been fixed with respect to the four nominal signal levels, such that four different signal levels can be discerned. A three-bit number that appears at the output of the comparators identifies any one of four detected symbol values.

The voltage margin is a figure of merit for a communication link, and is typically associated with the receiver circuit. Voltage margin may be defined as the maximum excess (or reduction) beyond a nominal, received signal level, that still results in the receiver detecting the correct symbol value (which is ordinarily represented by the nominal level). For instance, consider a 4 PAM link in which a signal level of +3.0 Volts represents the nominal signal level for symbol #3, a signal level of +1.0 Volt represents the nominal level for symbol #2, and a signal level of −1.0 Volt represents symbol #1. If the comparator reference levels used to discern between symbol #2 and the other symbols is selected to be +2.0 Volts and 0.0 Volts, then the maximum excess above 1.0 Volt that would still permit the comparator to correctly detect symbol #2 would be approximately one (1) Volt. In addition, the maximum reduction below 1.0 Volt that would still permit the comparator to correctly detect symbol #2 would also be one (1) Volt. Thus, the voltage margin for symbol #2, at this particular receiver circuit, would be one (1) Volt.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

Different embodiments of an apparatus and process for voltage margin testing of a transmission line analog signal at a data receiver are described. The data receiver includes one or more variable offset comparators (i.e., VOCs) that are used to detect transmitted symbols in the transmission line analog signal. The VOC is designed to have a substantially variable offset that is controllable to represent a variable reference level for that VOC. In other words, varying the reference of the VOC is performed by changing the VOC's offset. An output of the VOC is to provide a value that represents a comparison between an input signal level and the VOC reference level The term offset here refers to an imbalance in the internal circuitry and in the operation of the VOC. The offset is variable. While sweeping the offset from one extreme to another, the offset is said to be 'trimmed' to equal a known input signal level at the point in time when the VOC output changes states. According to an embodiment, the VOC has a differential signal input to receive a differential voltage level but no separate input to receive a reference voltage level as the reference voltage level is impliedly provided in the VOC (and is controlled by changing the offset).

According to an embodiment, a process and exemplary circuitry that can perform a "self-test" for voltage margin, using a digitally controllable version of the VOC, may advantageously be provided on-chip as part of the receiver circuit, thereby obviating the need for using conventional, stand-alone differential test equipment to determine the voltage margin. This helps reduce the costs of testing and calibrating the communication link prior to normal operation. In addition, a process for detecting, during normal operation, whether the link is operating outside a set voltage margin is described.

Figure 1:
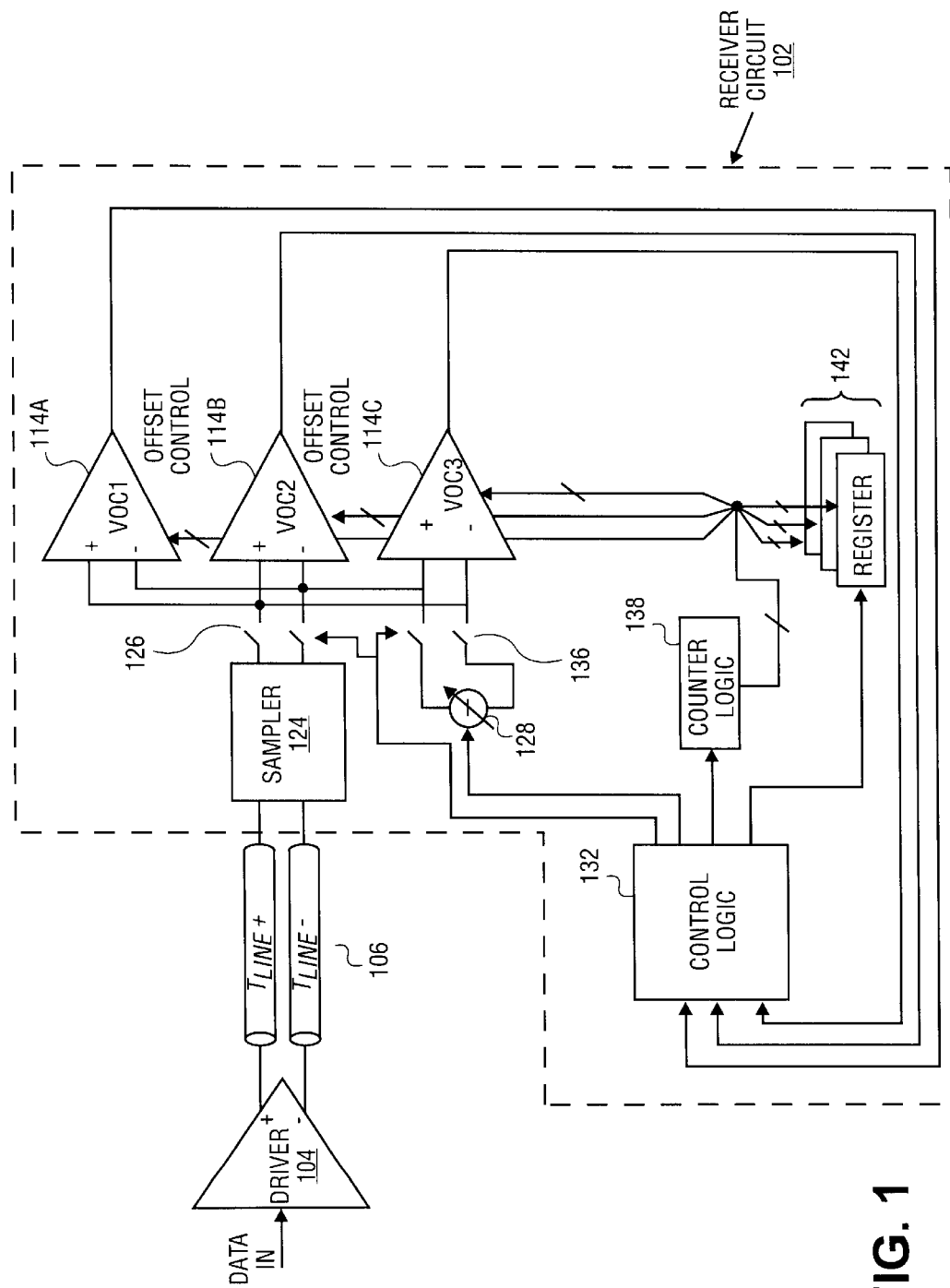
FIG. 1 shows a block diagram of a data communication link including an embodiment of a receiver circuit equipped with voltage margin testing capability.

Referring first to FIG. 1, a block diagram of a data communication link which features an embodiment of a receiver circuit 102 that is equipped with voltage margin testing capability is shown. The link features a driver 104 that drives a transmission line 106 with a multi-level transmission line analog signal. In multi-level communication links, the data may be transmitted in terms of symbols that represent two or more bits. The link may be operated according to a driver clock (not shown) which determines the rate at which symbols are transmitted into the transmission line 106. In this embodiment, a four level signal, corresponding to four unique symbol values, is driven. This is also referred to as a 4 PAM link. Of course, the 4 PAM link described here is only an example as the techniques described here can work with transmission line signals having two or more levels.

The embodiment of the receiver circuit 102 includes VOCs 114a, 114b, and 114c each of which has an input coupled to receive the same transmission line analog signal level. In the embodiment shown, the VOC input and the transmission line signal are differential rather than single ended, to reduce common mode noise. Alternatively, however, a single ended VOC input and/or a single ended transmission line signal may be used if the application can tolerate the higher common mode noise levels typically associated with single ended operation. An output of the VOC 114 is to provide a value that represents a comparison between the transmission line analog signal level and a reference level inherent in the VOC. The VOC 114 has a substantially variable offset that is controllable to represent a variable reference level. In other words, varying the reference level is performed by changing the offset of the VOC 114. In the embodiment of FIG. 1, the offset control input of the VOC 114 is to receive a multi-bit binary number, also known as the offset code, that sets the VOC reference level. As an alternative, an analog signal, which itself is not the reference voltage level, may be used to set the reference level.

Figure 2:
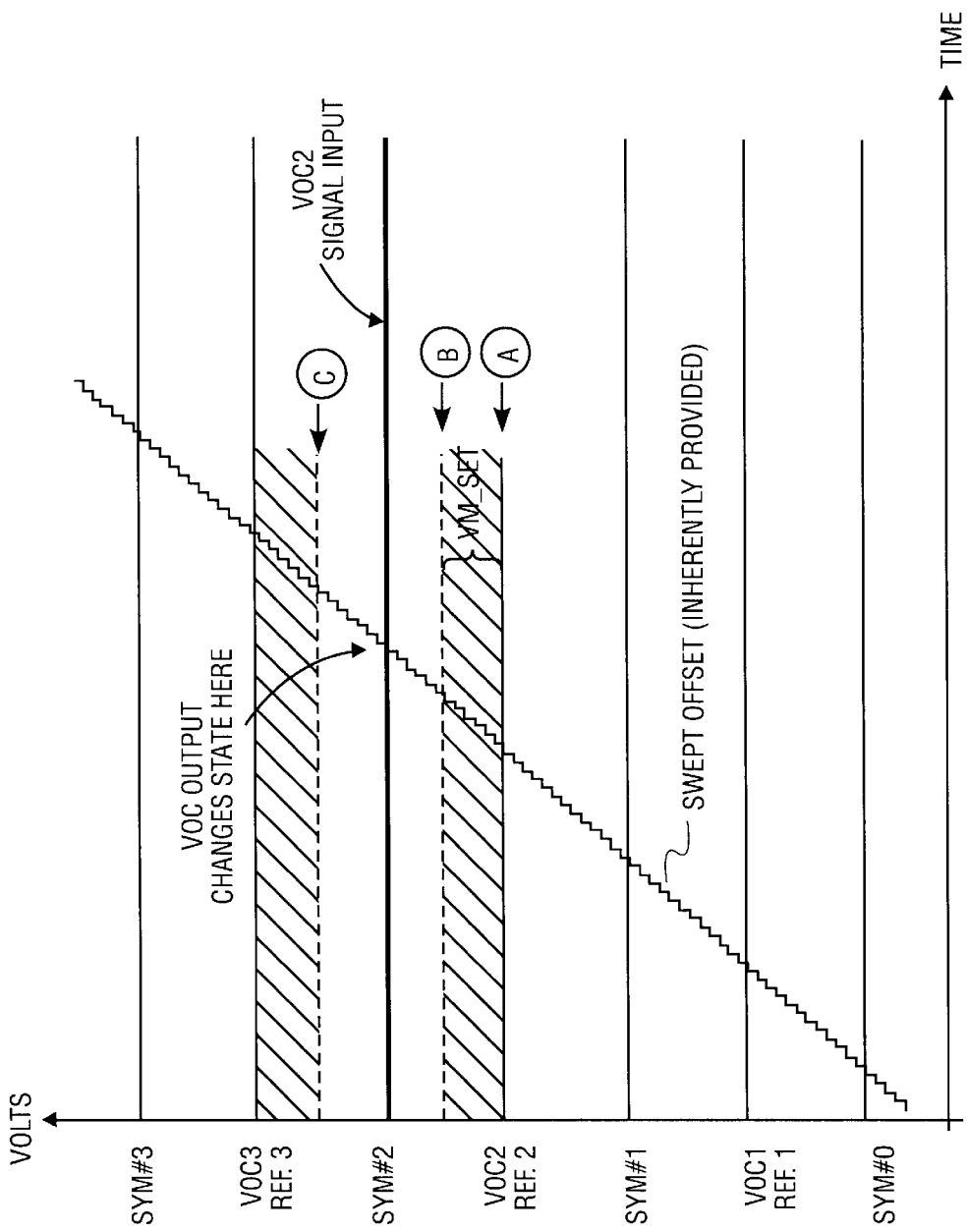
FIG. 2 illustrates a graph of the offset of a digitally controllable variable offset comparator, in terms of voltage, as it is swept through a symbol value being applied at the input of the comparator.

In the 4 PAM example, each transmitted symbol can have any one of four different symbol values assigned to it. Each value is identified by a different signal level (e.g. voltage level) of the transmission line signal. FIG. 2 shows a diagram of an exemplary set of four voltages that correspond to symbols 0–3. To detect all four symbols using the VOCs 114 shown in FIG. 1, the offsets are set so that each VOC has a different reference level as shown. This can be accomplished using, for instance, a reference calibration process, and associated circuitry, as described in U.S. patent application Ser. No. 09/968,349, entitled "Multi-Level Receiver With Digital Output Using a Variable Offset Comparator" of Casper, filed the same date as the present application (status: pending) and assigned to the same assignee as that of the present application.

Returning to FIG. 1, the VOC 114, in addition to the offset control input, has a signal input which, in this embodiment, is differential rather than single-ended. The signal input is coupled to receive either a transmission line analog voltage level from a sampler 124, or a known voltage level (i.e., precisely known at the time the receiver circuit 102 is being designed). This known voltage may be provided by a voltage reference circuit 128. The voltage reference circuit 128 may be based upon a conventional, temperature-compensated, bandgap reference circuit. Other means for supplying a known and accurate voltage level are possible.

The analog transmission line signal level that is provided to the input of each VOC may be a sampled analog voltage held by a sampler unit 124 as shown in the embodiment of FIG. 1. This sampler unit 124 may be implemented using a conventional sample and hold circuit whose output is to provide the transmission line analog signal level. Such a sampler unit 124 may be used to reduce jitter in the received data of a clocked high speed transmission link. In such an embodiment, the sampler unit 124 would be clocked by a receiver clock signal (not shown) that may be phase and frequency locked to a driver clock signal (not shown).

In another embodiment, the sampler unit 124 is not used, and the transmission line analog signal is fed directly to each input of the VOCs 114. In that case, the input of the VOC would be receiving a continuously variable voltage, such that the VOC itself or its latched output would be timed by the receiver clock.

In general, according to an embodiment, the driver data is transmitted as synchronized to a driver clock signal, while the received data is detected according to the timing provided by a receiver clock, where the receiver clock is phase and frequency locked to the driver clock. According to an embodiment, the receiver clock is derived from a received clock or strobe signal that was transmitted in sync with the data. This embodiment is also referred to as the source synchronous embodiment in which the synchronizing clock or strobe signal is transmitted on a separate transmission line than the one used for data (that is transmission line 106 in FIG. 1). According to another embodiment, the receiver clock is derived from a central reference clock that has been distributed to the driver and receiver circuits of the electronic system. Other alternatives for timing the detection of the received symbols are possible.

According to another embodiment, the receiver further includes transmission line termination resistors (not shown) coupled to the transmission line 106 in front of the sampler unit 124. In yet another embodiment, electrostatic discharge protection circuitry (not shown) is coupled to the transmission line 106 in front of the sampler unit 124. Other types of circuitry well known to those of ordinary skill in the art may be included in the receiver.

The means for applying either the transmission line signal level or the known voltage level to the VOC input may be accomplished by, for instance, two pairs of switches 126 and 136 connected as shown in FIG. 1. Other means for applying either the transmission line signal level or the known voltage level are possible as recognized by those of ordinary skill in the art.

Testing the voltage margin of the receiver circuit 102 also uses a means for controlling the variable offset of the VOC 114 within the range of one extreme of the offset to another extreme. For instance, referring to FIG. 2, which illustrates the range of offset available for the 4 PAM embodiment of the receiver circuit 102, the offset may be swept from one extreme, at a point beyond symbol #0, to another extreme, at a point beyond symbol #3. Alternatively, the offset may be swept over a portion of this range, if the circuit designer knows for certain that an expected change in the VOC output during the sweep will occur in the shorter portion.

In the embodiment of FIG. 1, digital control of the variable offset may be obtained by control logic 132 clocking counter logic 138 whose count output is coupled to the offset control input of the VOC 114. The counter logic 138 is to count from a start binary number to a stop binary number, where these two binary numbers cause opposite extremes of the offset available in the VOC 114. A greater number of bits in the binary number (i.e., the offset code) gives a greater resolution of VOC offset, in return for more complex circuitry in the VOC 114. Other means for controlling the variable offset of the VOC 114 are possible.

Testing for voltage margin also involves capturing the value of the variable offset which causes the VOC 114 to change states at its output. For example, as shown in FIG. 1, a bank of registers 142 may be provided as being coupled to latch the offset codes that are being fed to the control input of the VOCs 114. Other means for capturing the offset codes of the VOCs 114 are possible.

In the embodiment of FIG. 1, the control logic 132 may be designed to control the clocking, and the start and stop count values of the counter logic 138, so that the offset code is swept within a desired range. In addition, the control logic 132 is coupled to detect when the VOC output changes state during the sweep. Using this capability, the control logic 138 may ensure that the offset code which causes a VOC output to change states is immediately latched into the bank of registers 142. The control logic 132 also determines which of the transmission line analog signal level or the known voltage level are applied to the signal input of the VOC 114 while the offset code is swept, by appropriately configuring the switches 126 and 136. The control logic 132 may be implemented as a stand-alone state machine which runs upon initialization of the receiver circuit 102. As suggested above, the control logic 132, as well as the other components of the receiver circuit 102 shown in FIG. 1, may be advantageously formed on the same semiconductor integrated circuit die (i.e., IC chip) using a digital, complimentary metal oxide semiconductor (i.e., CMOS) fabrication process. Other means for controlling the components of the receiver circuit 102 may be possible.

Figure 3:
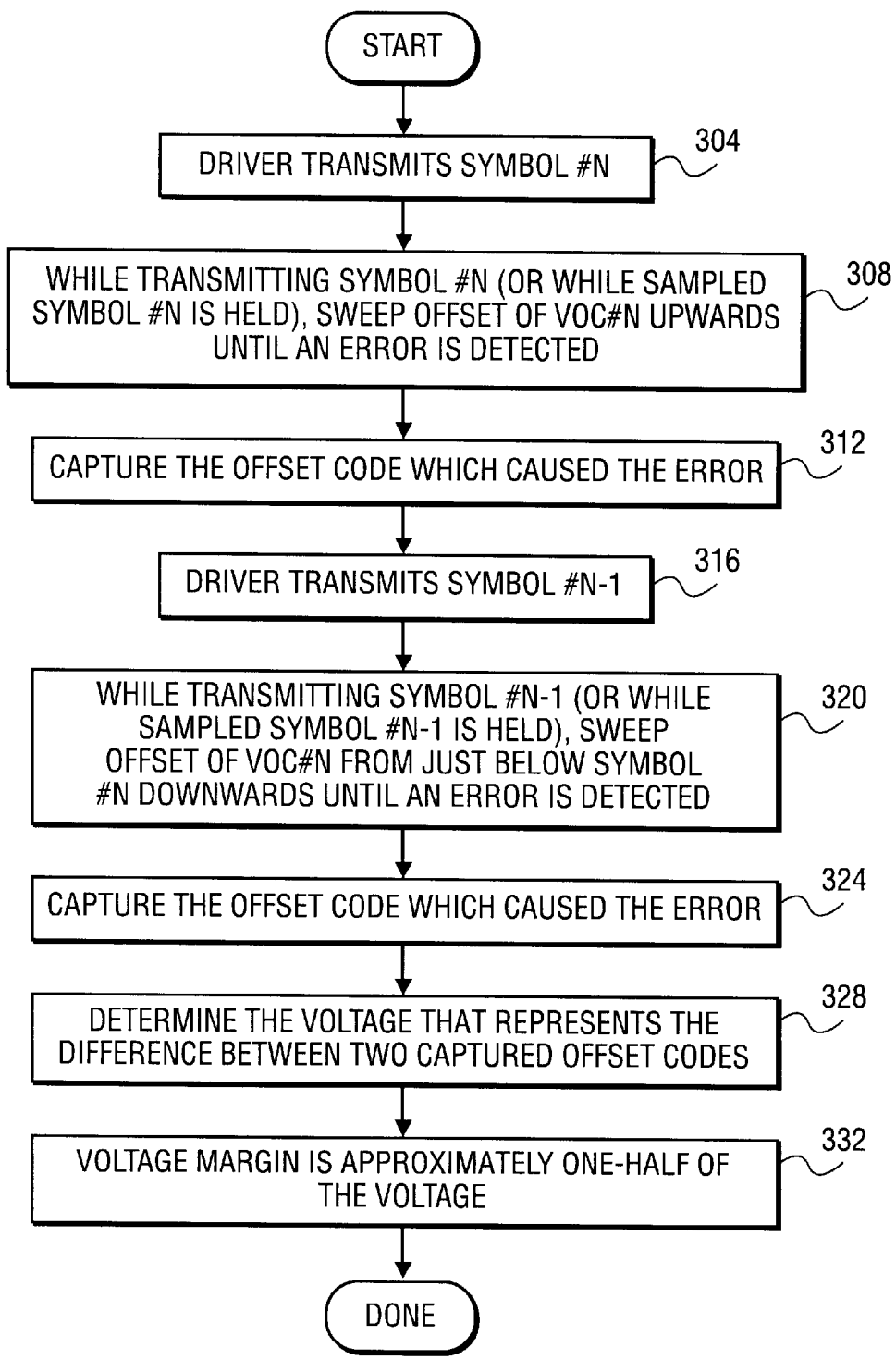
FIG. 3 depicts a flow diagram of an embodiment of a process for determining the voltage margin using a digitally controllable variable offset comparator.

Having described various embodiments of the receiver circuit 102, an embodiment of a process for testing the voltage margin of such a receiver circuit is now described using the flow diagram of FIG. 3. Certain operations of the process to be described will be performed entirely on-chip to the receiver circuit 102, according to the given embodiment. The process begins with operation 304 in which the driver 104 transmits symbol #N, where N may be any one of 1, 2, 3, . . . , depending upon the number of different symbol values that are defined in the link. As an example, let N=2 so that the graph in FIG. 2 may be used to illustrate the process. While transmitting symbol #2 (or while a sampled symbol #2 is held), the offset of VOC 2 is swept upwards until an error is detected (operation 308). In other words, while changing within a range of one extreme to another extreme the offset code which is fed to an offset control input of VOC 2, and while applying a fixed voltage level to a differential signal input of the VOC 2, the output of the VOC 2 is monitored until it changes states. As illustrated by the example of FIG. 2, the swept offset which is inherently provided by the VOC 2 may follow a staircase ramp until the impliedly provided reference voltage equals a voltage that represents symbol #2 which is being provided to the signal input of the VOC 2. Immediately upon the change of state at the VOC output, the offset code that is being fed to the offset control input of VOC 2 is captured (operation 312). This may be done by latching the offset code into a register at the moment the VOC output changes states (see FIG. 1). The captured offset code in essence represents the voltage level of symbol #2.

The process continues with operation 316 in which the driver transmits another symbol, this time symbol #N−1. In the example of FIG. 2, this would correspond to sending symbol #1. While again changing within a range of one extreme to another extreme the offset code as it is being fed to the offset control input of VOC 2, this time while applying a fixed voltage level corresponding to symbol #1 to the signal input of the VOC 2, the VOC 2 output is again monitored until a change of state occurs. Just as in operation 312, the offset code which caused this change of state is captured (operation 324). The latter captured offset code thus represents the voltage level of symbol #1.

Having determined the offset codes that represent symbols #1 and #2, a voltage that represents the difference between these two captured offset codes is determined (operation 328). The voltage margin is defined, in this embodiment, as being approximately one-half of this voltage (operation 332). Thus, if symbols #1 and #2 were separated by 2.0 Volts, then the voltage margin, as a maximum reduction in voltage level of symbol #2, would be approximately one (1) Volt. Similarly, the voltage margin, as a maximum excess in the voltage level of symbol #1 would also be one (1) Volt. This presumes that there are no intermediate voltage levels, between that of symbol #1 and symbol #2, that represent any symbol values that can be transmitted in the data communication link.

The process depicted in FIG. 3 may be repeated to determine voltage margins for other symbols that can be transmitted in the link, in the same manner described above. Note that operations 308, 312, 320, 324, and 328 may be performed by entirely on-chip components which are described above in connection with FIG. 1.

Figure 4:
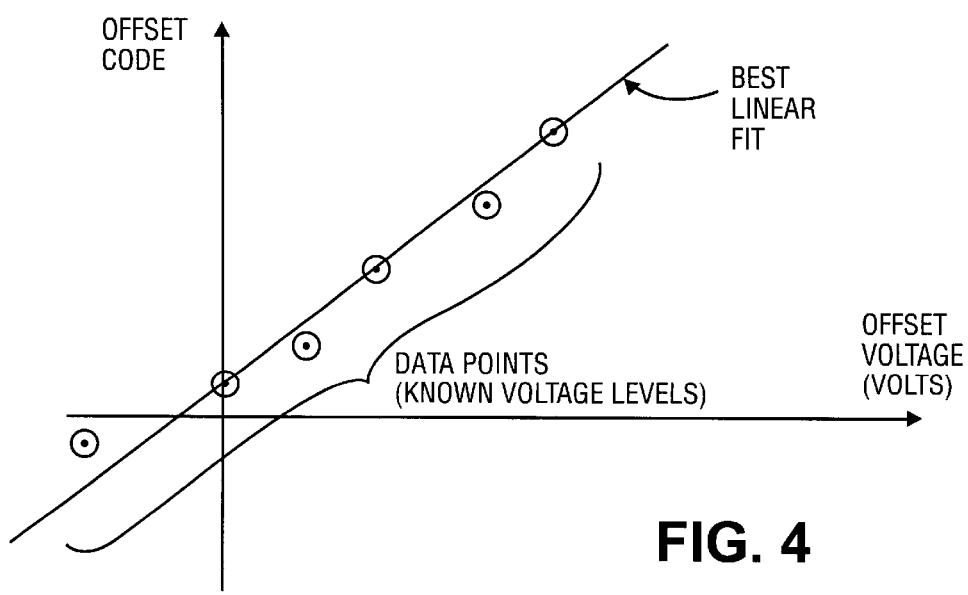
FIG. 4 shows a graph of offset code versus offset voltage in which measured data points, using an embodiment of the receiver circuit, are shown together with a best linear fit.

The process depicted in FIG. 3 involves operation 328 in which a voltage that represents the difference between two captured offset codes is determined. The determination of such a voltage level may also be performed by an entirely on-chip procedure using the embodiment of FIG. 1. In most practical implementations of the communication link, there is an unknown relationship between the offset code and the offset voltage (where the latter is given in units of Volts) measured at the signal input of the VOC. One way to determine this relationship is to disconnect the inputs of the VOCs 114 from the transmission line 106 by opening switches 126 (see FIG. 1). Next, switches 136 are closed such that a source of known voltage levels can be applied to the signal input of the VOCs 114. A number of different fixed voltage levels whose values are known at the time of the circuit design are then sequentially applied to the signal input of the VOC. The offset code which causes the VOC output to change state while each known voltage is being applied to the signal input is captured. Data points with coordinates of offset voltage and corresponding offset code can then be plotted on an X-Y coordinate system as shown in FIG. 4. Assuming the relationship between the offset code and the offset voltage of the VOC is linear, a best linear fit may be computed after a certain number of data points have been measured. This best linear fit may then be used to provide the corresponding offset voltage for any given offset code, as may be called for in operation 328 (see FIG. 3). A flow diagram of an embodiment of a process for determining this relationship is shown in FIG. 5.

Figure 5:
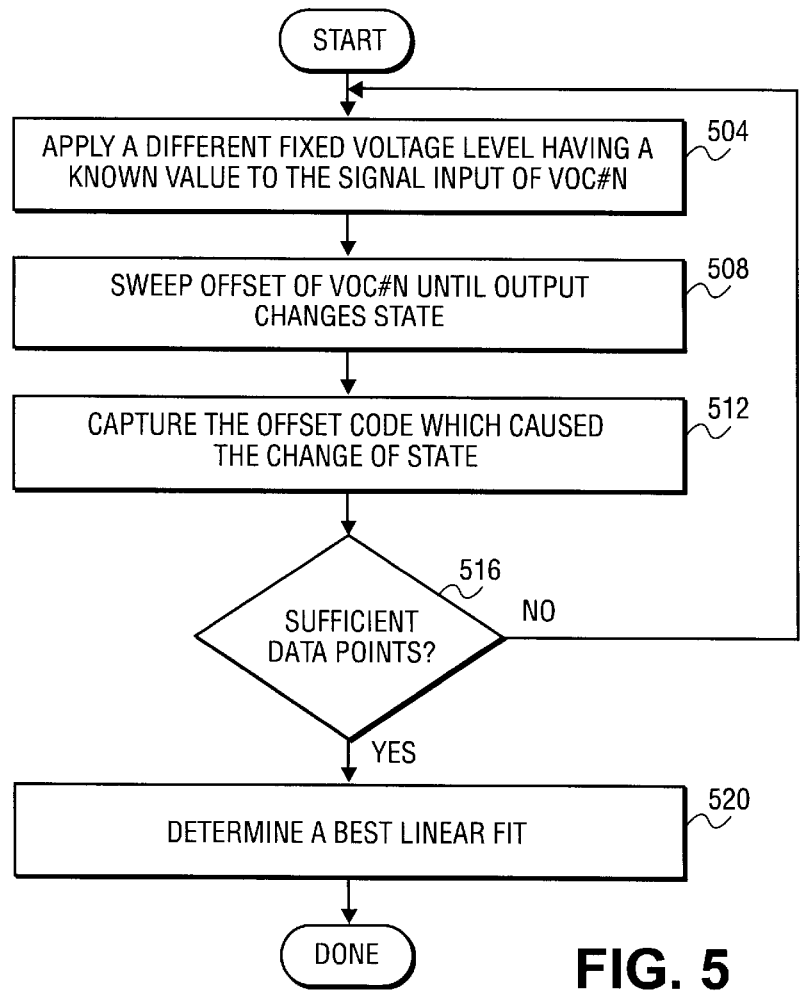
FIG. 5 illustrates a flow diagram of an embodiment of a process for determining the relationship between input voltage to the comparator and its offset code.

Operation begins in FIG. 5 with applying a fixed voltage level, having a known value at the time of the circuit design, to the signal input of VOC #N. The offset of VOC #N is then swept until its output changes state (operation 508). At that moment, the offset code which caused the change of state is captured (operation 512). If sufficient data points have been collected (operation 516) then a best linear fit is determined according to conventional mathematical techniques (operation 520). If there are insufficient points, then the process loops back to operation 504 in which a different fixed voltage level is applied to generate another data point (see FIG. 4). According to an embodiment, at least two data points will be measured as described in FIG. 5, after which a best linear fit may be computed.

Figure 6:
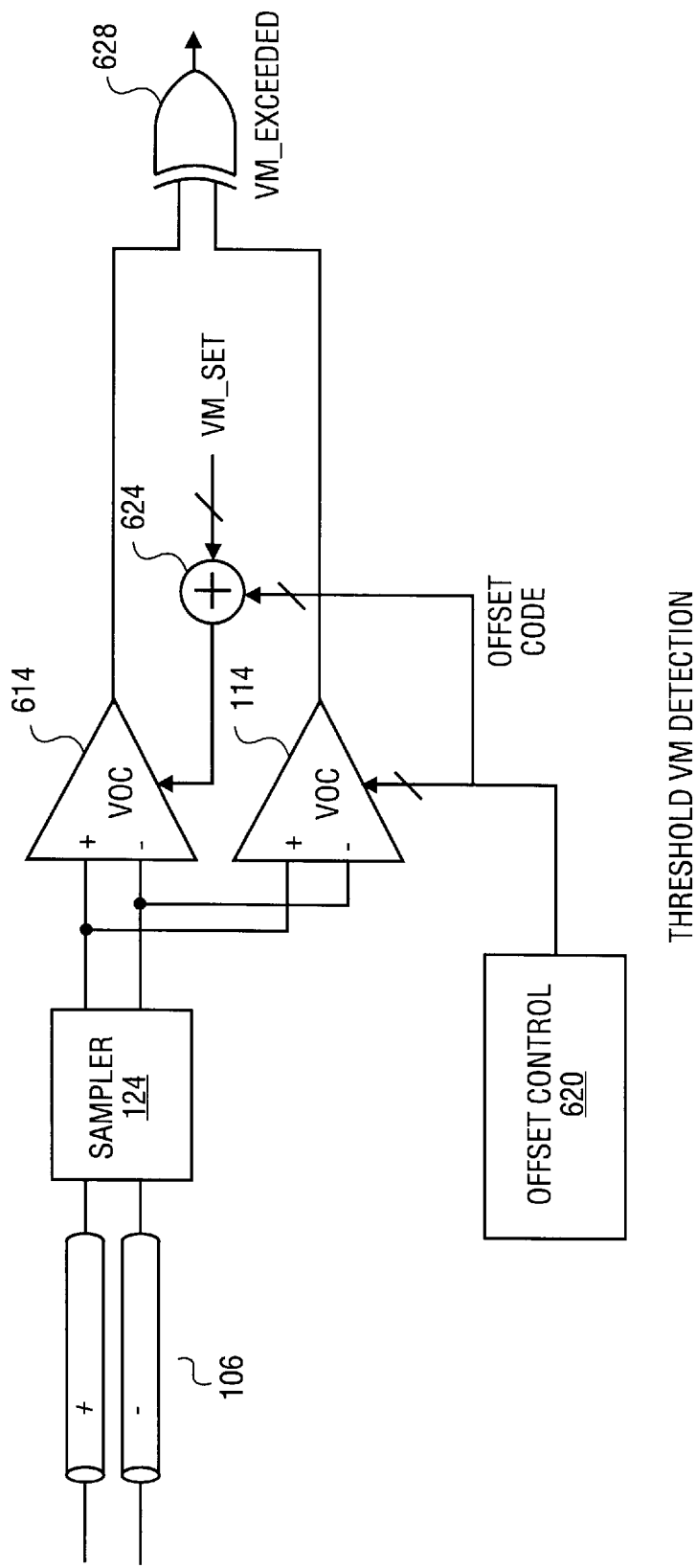
FIG. 6 depicts a block diagram of a receiver circuit that features a variable offset comparator and that is capable of detecting when a set voltage margin has been exceeded.

Referring now to FIG. 6, what is shown is a block diagram of a threshold voltage margin detection scheme using the VOC 114 in a data receiver circuit. What is desired here is an indication of when a set voltage margin has been exceeded at a receiver circuit. The receiver circuit includes some of the components of the embodiments described above including the VOC 114 whose offset code is set by offset control logic 620. This offset code is determined, based upon the various techniques described above, to represent a reference voltage level against which an analog transmission line signal level is compared by the VOC 114. A sampler 124 which may provide a sampled and held version of a signal received from the transmission line 106 is coupled to provide a signal level to both VOC 114 and an additional VOC 614. VOC 614 may be a replicate of VOC 114. The offset control input of the VOC 614 receives an offset code which is given by the sum of the offset code to VOC 114 and a binary value referred to as VM_set. A hardware adder 624 may be used to perform such an addition.

The binary number of VM_set represents the maximum excess above (or reduction below) the nominal symbol level. To illustrate, assume that the VOC 114 in FIG. 6 has its reference level set (by its offset code) to level A shown in FIG. 2. Also, assume that VOC 614 has its offset code set to level B, where this level is obtained by adding the offset code corresponding to level A to a binary number VM_set. If the receiver circuit is now allowed to detect symbol #2 at the input of the VOC 114, then whenever symbol #2 is expected to be received, the outputs of VOCs 114 and 614 will both be in the logic '1' state, since as seen in FIG. 2 the level corresponding to symbol #2 is greater than both level A and level B. This means that the output of the exclusive-or gate 628 is, by definition, at logic '0'. Now, should the transmission line signal be distorted such that the input signal at the VOCs 114 and 116 were to drop below level B, but not below level A, then the output of VOC 614 would change states to logic '0'. This would cause the output of exclusive-or gate 628 to change to logic '1', because the output of VOC 114 will remain unchanged at logic '1'. Thus, it can be seen that when symbol #2 is supposed to be detected by the receiver circuit shown in FIG. 6, the voltage margin exceeded signal (VM_exceeded) will transition to logic '1' whenever the transmission line signal level drops too low into the shaded zone between levels A and B shown in FIG. 2. A similar modification may be made to the receiver circuit shown in FIG. 6 to detect when the transmission line signal, while expecting to be transmitting symbol #2, increases into a "forbidden" zone above level C as shown in FIG. 2. The range of input signal between levels B and C as shown in FIG. 2 would be the maximum allowed variation in the transmission line signal for symbol #2, such that any variation above level C or below level B would be detected by the circuit shown in FIG. 6. The VM_exceeded indication in FIG. 6 could be used to, for instance, signal a warning to the system, of which the communication link is a part, that the maximum permissible margin for this symbol being transmitted is being exceeded and that potential errors in the detection of the symbol is likely.

Figure 7:
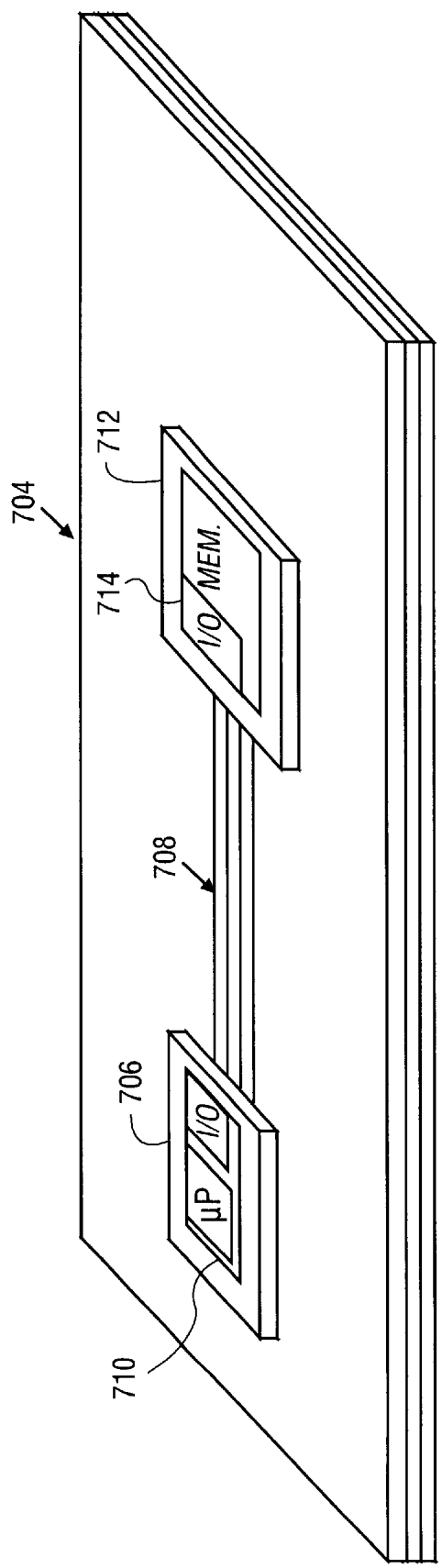
FIG. 7 illustrates a block diagram of an electronic system in which a communication link, whose voltage margin can be tested according to an embodiment of the invention, is provided.

Turning now to FIG. 7, what is shown is a block diagram of an embodiment of an electronic system in which a communication link features the receiver described above. The system has a multi-layer printed wiring board 704 on which a parallel bus 708 is formed. The bus 708 may be of the point to point variety, or a multi-drop bus such as those used in a main memory. An integrated circuit (IC) chip package 706 is operatively installed on the board to communicate using the parallel bus 708. The installation of the package 706 may be done by a surface mount technique or via a connector or socket. The package has an IC chip 710 that includes a logic function section, and an I/O section as an interface between the logic function section and the bus 708. The logic function suction may be one of the following well-known devices: a microprocessor, a memory controller, and a bus bridge. Alternatively, other devices that can be implemented in the logic function section of an IC chip may be used. The I/O section has a bus receiver in which a receiver as described above is provided.

A second IC package 712 is also installed on the board 704 to communicate with the first package 706 via the bus 708. The second IC package 712 also includes a chip 714 having an I/O section in which a bus receiver is provided to interface the bus 708, and its own logic function section (here shown as a memory controller).

According to an embodiment, the I/O interfaces of the two chips 710 and 714 communicate with each other bi-directionally, that is using the same conductive lines of the bus for both transmitting and receiving data. Thus, in such an embodiment, drivers are provided, in both IC chips, that are connected to the same conductive lines of the bus 708. Other system applications of the receiver are possible, including, for example, a cable receiver.

Figure 8:
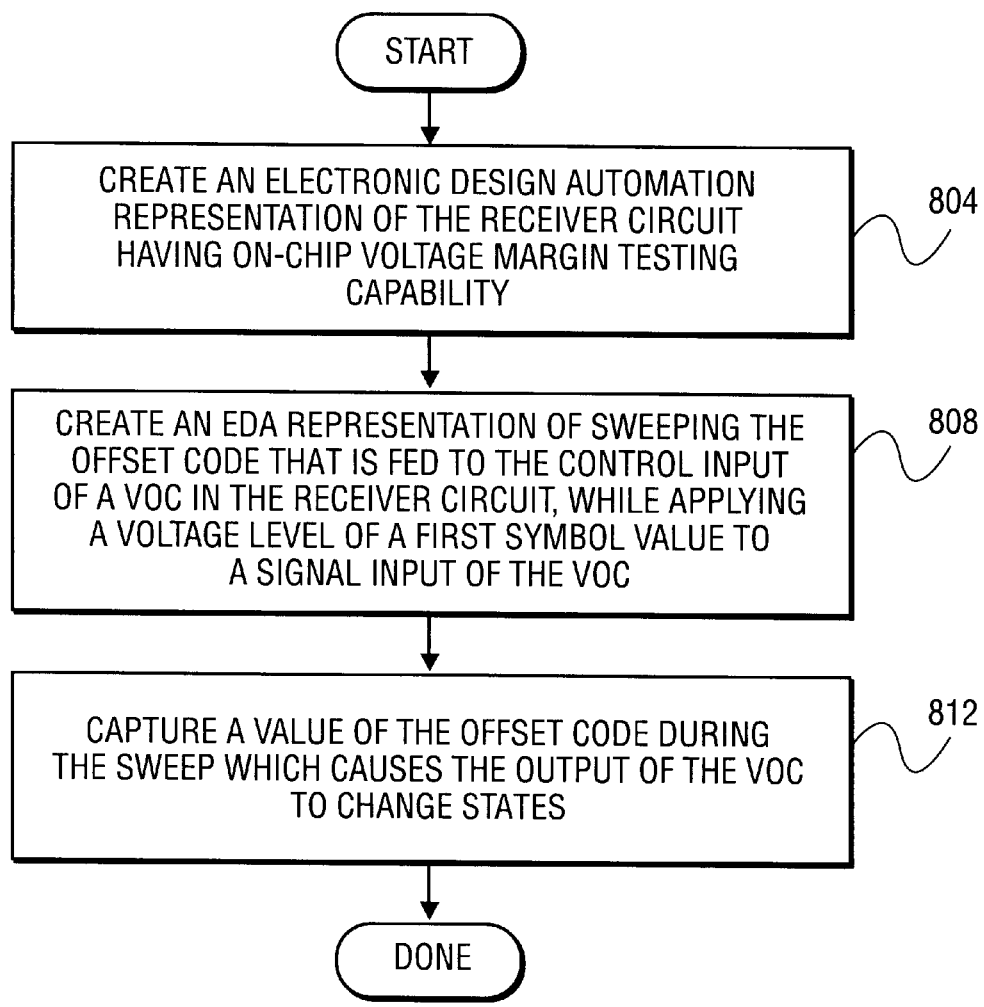
FIG. 8 shows a flow diagram of an embodiment of a computer-implemented process for designing the receiver circuit.

Referring now to FIG. 8, a flow diagram of an embodiment of a computer-implemented method for designing the receiver circuit described above is shown. The embodiments of the receiver circuit described above may be designed and simulated using conventional computer-aided design and electronic design automation tools. The method involves the creation of a representation of a process for operating a receiver circuit in a data communication link as described above in connection with FIGS. 1–7 (operation 804). The representation includes the VOC 114 that has a substantially variable offset which is controllable to represent a variable reference level, without a separate input to receive a reference voltage level.

The method also includes representing the process for operating the receiver circuit as further including the task of changing an offset code which is fed to an offset control input of the VOC 114, while applying a voltage level that represents a symbol value being transmitted, to a differential signal input of the VOC 114 (operation 808). The representation of the process also includes the operation of capturing a value of the offset code which causes the output of the VOC 115 to change states (operation 812). The above described operations of 804–812 can be repeated to capture a value of the offset code for each different symbol value that can be transmitted. In general, electronic design automation representations of all embodiments described above may be created using conventional techniques well known to those of ordinary skill in the art in view of the disclosure herein. It should be noted that these representations may be stored in digital form, as part of, for instance, a hardware description language file in a fixed or portable computer memory device, such as a hard disk drive or a compact disk. Such a file will contain instructions that, when executed by a machine such as a computer work station, cause the machine to display and perhaps simulate operation of the receiver circuit and the voltage margin testing techniques, as part of a larger electronic system.

In the foregoing specification, the invention has been described with reference to specific exemplary embodiments thereof. It will, however, be evident that various modifications and changes may be made thereto without departing from the broader spirit and scope of the invention as set forth in the appended claims. For example, as an alternative to the data communication link operating according to PAM, other modulation schemes that involve some form of amplitude (level) modulation may be used to define the symbol values that can be transmitted. The specification and drawings are, accordingly, to be regarded in an illustrative rather than a restrictive sense.

What is claimed is:

1. A method comprising:

while changing a binary number that is being fed to an offset control input of a comparator, and while applying a first fixed voltage level to a differential signal input of the comparator, wherein the comparator has substantially variable offset that is controllable to represent a variable reference level without a separate input to receive a reference voltage level, and wherein the comparator has an output to provide a value that represents a comparison between the first fixed voltage level and the variable reference level, the comparator being a part of a receiver circuit in a data communication link in which the first voltage represents a first symbol value being transmitted, capturing a value of the binary number which causes the output of the comparator to change states.

2. The method of claim 1 further comprising:

after capturing the value of the binary number, and while again changing the binary number as it is being fed to the offset control input of the comparator, this time while applying a second fixed voltage level to the signal input of the comparator, wherein the second voltage represents a second, different symbol value being transmitted, capturing a value of the binary number which causes the output of the comparator to change states.

3. The method of claim 2 wherein there are no intermediate voltage levels, between the first and second voltage levels, that represent any symbol values that can be transmitted in the data communication link.

4. The method of claim 3 further comprising:

determining a voltage level that is represented by a difference between the two captured binary values.

5. The method of claim 2 further comprising:

while changing the binary number as it is being fed to the offset control input of the comparator, this time while applying a third fixed voltage level to the signal input of the comparator, wherein the third voltage level has an exactly known value, capturing a value of the binary number which causes the output of the comparator to change states; and then while changing the binary number as it is being fed to the offset control input of the comparator, this time while applying a fourth fixed voltage level to the signal input of the comparator, wherein the fourth voltage level has an exactly known value different from that of the third voltage level, capturing a value of the binary number which causes the output of the comparator to change states.

6. The method of claim 5 further comprising:

determining a mathematical, linear relationship between an offset code variable, which represents the binary number being fed to the offset control input, and an offset voltage variable that represents the voltage at the signal input of the comparator, based upon setting the offset voltage variable equal to the known values of the third and fourth voltage levels.

7. The method of claim 1 wherein the data communication link operates according to pulse amplitude modulation.

8. An integrated circuit die comprising:

a comparator having an offset control input and a differential signal input, the signal input being coupled to receive a transmission line analog voltage level, the comparator has substantially variable offset that is controllable to represent a variable reference level without a separate input to receive a voltage reference level, and the comparator has an output to provide a value that represents a comparison between a voltage at the signal input and the variable reference level;

a counter coupled to the offset control input to provide a changing binary number to said control input;

control logic coupled to control the counter so that the binary number can be changed and to detect when the comparator output changes states; and a register coupled to store the binary number and to be controlled by the control logic so that a value of the binary number which causes the output of the comparator to change states is captured by the register.

9. The integrated circuit die of claim 8 further comprising:

a voltage reference circuit coupled to provide a known, temperature compensated, and accurate voltage level to the signal input of the comparator under control of the control logic, wherein the control logic is to decide which one of the known voltage level and the transmission line analog signal level are applied to the signal input of the comparator.

10. The integrated circuit die of claim 8 wherein the comparator includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

11. An integrated circuit comprising:

means for comparing a transmission line analog differential voltage level to a variable reference level, the comparison means having substantially variable offset that is controllable to represent the variable reference level without a separate input to receive a voltage reference level;

means for changing the variable offset; and means for capturing a value of the variable offset which causes the comparison means to change states at its output.

12. The integrated circuit of claim 11 further comprising:

means for supplying a known, temperature compensated, and accurate voltage level to the comparison means; and means for applying one of the known voltage level and the transmission line analog signal level to the comparison means.

13. The integrated circuit of claim 12 further comprising:

means for capturing a value of the variable offset which causes the comparison means to change states at its output while the known voltage level is being applied and while the variable offset is being changed.

14. An electronic system comprising:

a printed wiring board on which a parallel bus is formed, an integrated circuit (IC) chip package being operatively installed on the board to communicate using the parallel bus, the package having an IC chip that includes a logic function section and an I/O section as an interface between the logic function section and the bus, the I/O section having a bus receiver in which a comparator has a differential signal input coupled to receive a transmission line analog signal level, the comparator has substantially variable offset that is controllable to represent a variable reference level and without a separate input to receive a reference voltage level, an output of the comparator is to provide a value that represents a comparison between the transmission line analog signal level and the reference level, the bus receiver further includes a counter coupled to the offset control input to provide a changing binary number to said control input, control logic coupled to control the counter so that the binary number can be changed and to detect when the comparator output changes states, and a register coupled to store the binary number and to be controlled by the control logic so that a value of the binary number which causes the output of the comparator to change states is captured by the register.

15. The electronic system of claim 14 wherein the printed wiring board further includes a second IC chip package operatively installed on the board to communicate using the bus, the second package having an IC chip that includes an I/O section to transmit a symbol value over the bus, and wherein the transmission line analog signal level represents the transmitted symbol value.

16. The electronic system of claim 14 wherein the bus receiver further includes a voltage reference circuit coupled to provide a known, temperature compensated, and accurate voltage level to the signal input of the comparator under control of the control logic, wherein the control logic is to decide which one of the known voltage level and the transmission line analog signal level are applied to the signal input of the comparator.

17. The electronic system of claim 14 wherein the comparator includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

18. An article of manufacture comprising:

a machine-readable medium having instructions stored thereon which, when executed by a processor, cause an electronic system to display a representation of a process for operating a receiver circuit in a data communication link in which a first voltage level represents a first symbol value being transmitted, the receiver circuit having a comparator that has a substantially variable offset which is controllable to represent a variable reference level without a separate input to receive a reference voltage level, the process being represented includes, while changing a binary number that is being fed to an offset control input of the comparator, and while applying the first voltage level to a differential signal input of the comparator, and wherein the comparator has an output to provide a value that represents a comparison between the first fixed voltage level and the variable reference level, capturing a value of the binary number which causes the output of the comparator to change states.

19. The article of manufacture of claim 18 wherein the medium includes further instructions that, when executed by the processor, cause the electronic system to further display a representation of the process in which, after capturing the value of the binary number, and while again changing the binary number as it is being fed to the offset control input of the comparator, this time while applying a second fixed voltage level to the signal input of the comparator, wherein the second voltage level represents a second, different symbol value being transmitted, capturing a value of the binary number which causes the output of the comparator to change states.

20. The article of manufacture of claim 19 wherein the medium includes further instructions that, when executed by the processor, cause the electronic system to further display a representation of the process in which, while changing the binary number as it is being fed to the offset control input of the comparator, this time while applying a third fixed voltage level to the signal input of the comparator, wherein the third voltage level has an exactly known value, capturing a value of the binary number which causes the output of the comparator to change states, and then while changing the binary number as it is being fed to the offset control input of the comparator, this time while applying a fourth fixed voltage level to the signal input of the comparator, wherein the fourth voltage level has an exactly known value, capturing a value of the binary number which causes the output of the comparator to change states.

* * * * *